United States Patent
Abbink et al.

(10) Patent No.: US 8,579,502 B2
(45) Date of Patent: Nov. 12, 2013

(54) METHOD FOR DETERMINING LEAK RATE THROUGH A BOND LINE OF A MEMS DEVICE

(75) Inventors: Henry C. Abbink, Westlake Village, CA (US); Gabriel M. Kuhn, West Hills, CA (US); Howard Ge, Alhambra, CA (US); Daryl Sakaida, Simi Valley, CA (US)

(73) Assignee: Northrop Grumman Corporation, El Segundo, CA (US)

( * ) Notice: Subject to any disclaimer, the term of this patent is extended or adjusted under 35 U.S.C. 154(b) by 82 days.

(21) Appl. No.: 13/185,723

(22) Filed: Jul. 19, 2011

(65) Prior Publication Data

US 2011/0271744 A1     Nov. 10, 2011

Related U.S. Application Data

(62) Division of application No. 11/914,932, filed as application No. PCT/US2006/020084 on May 24, 2006, now Pat. No. 8,007,166.

(60) Provisional application No. 60/684,431, filed on May 25, 2005.

(51) Int. Cl.
*G01N 25/06* (2006.01)
*G01N 25/14* (2006.01)

(52) U.S. Cl.
USPC .................... 374/5; 374/45; 374/57

(58) Field of Classification Search
USPC ........... 374/4, 5, 100, 102, 57, 141–143, 178; 73/40–49 R
See application file for complete search history.

(56) References Cited

U.S. PATENT DOCUMENTS

| | | |
|---|---|---|
| 4,152,477 A | 5/1979 | Haruta et al. |
| 5,827,951 A | 10/1998 | Yost et al. |
| 6,287,437 B1 | 9/2001 | Pandhumsoporn et al. |
| 6,422,744 B1 * | 7/2002 | Galenkamp et al. ............ 374/57 |
| 6,491,426 B1 | 12/2002 | Schonath et al. |
| 6,821,802 B2 | 11/2004 | Ahn et al. |
| 6,879,048 B2 | 4/2005 | Jordan et al. |

(Continued)

FOREIGN PATENT DOCUMENTS

| | | |
|---|---|---|
| EP | 0 369 352 | 5/1990 |
| EP | 0 611 221 | 8/1994 |
| EP | 1 279 941 | 1/2003 |
| EP | 1 524 511 | 4/2005 |

OTHER PUBLICATIONS

PCT Notification of Transmittal of the International Search Report and the Written Opinion of the International Searching Authority dated Jan. 12, 2007 for International Application No. PCT/US2006/020084 filed May 24, 2006.

*Primary Examiner* — Gail Verbitsky
(74) *Attorney, Agent, or Firm* — Snell & Wilmer L.L.P.; Albin H. Gess

(57) ABSTRACT

A method for optimizing direct wafer bond line width for reduction of parasitic capacitance in a MEMS device by reducing the width of a bond line between a first and a second wafer, exposing the MEMS device to a water vapor for a predetermined time period and at a first temperature capable of evaporating water, cooling the MEMS device at a second temperature capable of freezing the water, and operating the MEMS device at a third temperature capable of freezing the water to determine if there is discontinuity during operation.

7 Claims, 6 Drawing Sheets

(56) References Cited

U.S. PATENT DOCUMENTS

| | | |
|---|---|---|
| 6,912,778 B2 | 7/2005 | Ahn et al. |
| 7,210,337 B1 * | 5/2007 | Jarrett ............... 73/49.3 |
| 7,287,903 B2 | 10/2007 | Estes et al. |
| 7,299,681 B2 * | 11/2007 | Cummings ............ 73/40 |
| 7,338,818 B2 | 3/2008 | Arroyo et al. |
| 7,410,880 B2 * | 8/2008 | Best et al. ............ 438/401 |
| 7,416,984 B2 | 8/2008 | Martin et al. |
| 7,425,093 B2 * | 9/2008 | Wickersham et al. ....... 374/5 |
| 7,443,017 B2 | 10/2008 | Haluzak et al. |
| 7,651,260 B2 | 1/2010 | Hamann et al. |
| 7,654,734 B2 | 2/2010 | Jiang et al. |
| 7,732,713 B2 | 6/2010 | Grube et al. |
| 2003/0019282 A1 | 1/2003 | Cramer |
| 2004/0057043 A1 * | 3/2004 | Newman et al. ........ 356/237.1 |
| 2004/0163717 A1 * | 8/2004 | Gilleo ............ 137/565.29 |
| 2006/0094149 A1 * | 5/2006 | Chen et al. ............ 438/48 |
| 2006/0292748 A1 | 12/2006 | Haluzak et al. |
| 2008/0029880 A1 * | 2/2008 | Chen et al. ............ 257/704 |
| 2008/0191729 A1 | 8/2008 | Blanco et al. |
| 2009/0090409 A1 | 4/2009 | Moczygemba |
| 2009/0194309 A1 | 8/2009 | Gillot et al. |
| 2010/0046574 A1 | 2/2010 | Hamann et al. |
| 2010/0066393 A1 | 3/2010 | Bottoms et al. |
| 2011/0227173 A1 * | 9/2011 | Seppala et al. ........... 257/415 |
| 2012/0015456 A1 * | 1/2012 | Thompson et al. ......... 438/15 |

\* cited by examiner

METHOD FOR DETERMINING LEAK RATE THROUGH A BOND LINE OF A MEMS DEVICE

CROSS REFERENCE TO RELATED APPLICATIONS

This application is a division of application Ser. No. 11/914,932, filed Nov. 19, 2007 for Method of Optimizing Direct Wafer Bond Line Width for Reduction of Parasitic Capacitance in MEMS Accelerometers.

BACKGROUND OF THE INVENTION

1. Field of the Invention

The invention relates generally to Micro-Electro-Mechanical Systems (MEMS). More particularly, the invention relates to a method for optimizing wafer bond line width for reduction of parasitic capacitance in MEMS accelerometers and a method of determining leak rate through a bond line.

2. Description of Related Art

Micro-Electro-Mechanical Systems (MEMS) is the integration of mechanical elements, sensors, actuators, and electronics on a common silicon substrate through microfabrication technology. The electronics in a MEMS device are fabricated using Integrated Circuit (IC) technology (CMOS, Bipolar, or BICMOS processes), while the micromechanical components are fabricated using "micromachining" techniques that selectively etch away or add new layers to the silicon wafer to form mechanical and electromechanical devices.

MEMS devices are widely used in automotives, navigation systems, chemical and biological sensors, microoptics, accelerometers, pressure sensors and other devices. A common approach to fabrication of MEMS devices is the so-called bulk MEMS process. This process consists of processing two or three silicon wafers with patterns machined by Deep Reactive Ion Etching (DRIE) to form the structure used in each layer, and then bonding these layers together by a process called direct bonding to form a hermetic cavity.

SUMMARY OF THE INVENTION

A process for optimizing direct wafer bond line width for reduction of parasitic capacitance in a MEMS device and determining leak rate through a bond line. The process involves reducing the width of a bond line between a first and a second wafer, exposing the MEMS device to water vapor for a predetermined time period and at a first temperature capable of evaporating the water, cooling the MEMS device at a second temperature capable of freezing the water, and operating the MEMS device at a third temperature capable of freezing the water to determine if there is discontinuity during operation.

In one embodiment the bond line width is reduced to approximately 100-200 microns. To optimize direct wafer bond, a different bond line width can be used to determine its operability and reliability at design conditions.

In another embodiment the first temperature used for evaporating water is approximately 100° C. The second temperature can approximately be below 0° C., preferably about −55° C. The third temperature can be approximately equal to the second temperature.

The process further includes a method of calculating the leak rate through the bond line by dividing the volume of fluid in the MEMS device by the predetermined time period. To achieve an acceptable leak rate, a different bond line width of the MEMS device can be used to reduce discontinuity during operation and achieve optimum operability and reliability of the MEMS device.

BRIEF DESCRIPTION OF THE DRAWINGS

The exact nature of this invention, as well as the objects and advantages thereof, will become readily apparent from consideration of the following specification in conjunction with the accompanying drawings in which like reference numerals designate like parts throughout the figures thereof and wherein.

DETAILED DESCRIPTION OF THE PREFERRED EMBODIMENTS

Methods and systems that implement the embodiments of the various features of the invention will now be described with reference to the drawings. The drawings and the associated descriptions are provided to illustrate embodiments of the invention and not to limit the scope of the invention. Reference in the specification to "one embodiment" or "an embodiment" is intended to indicate that a particular feature, structure, or characteristic described in connection with the embodiment is included in at least an embodiment of the invention. The appearances of the phrase "in one embodiment" or "an embodiment" in various places in the specification are not necessarily all referring to the same embodiment. Throughout the drawings, reference numbers are re-used to indicate correspondence between referenced elements. In addition, the first digit of each reference number indicates the figure in which the element first appears.

Figure 1:
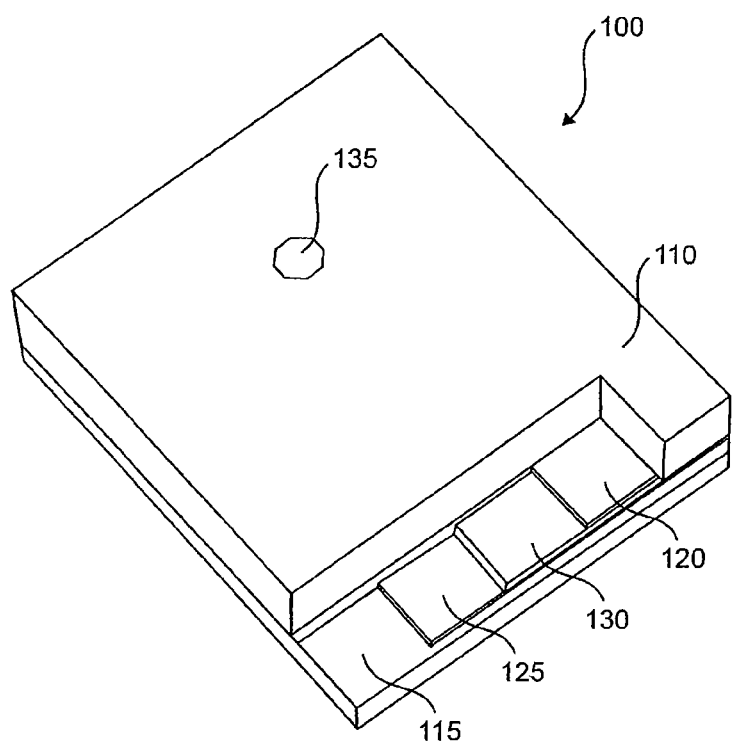
FIG. 1 is a perspective view of a prior art silicon accelerometer sensor.

FIG. 1 is a perspective view of a prior art silicon accelerometer sensor 100 before assembly. The sensor 100 has a first outside layer 110, a second outside layer 115, a first guard layer 120, a second guard layer 125, and a proof mass layer 130. The proof mass layer 130 is sandwiched between the first and second guard layers 120 and 125, which are then sandwiched between the first and second outside layers 110 and 115. The sensor 100 also has a via 135 to facilitate a path or opening for circuit shorting. The sensor 100 is fabricated from two silicon-on-insulator (SOI) wafers and one prime silicon wafer. The SOI wafers provide the first and second outside layers 110 and 115, and the first and second guard layers 120 and 125. The prime silicon wafer provides the proof mass layer 130.

On the surface of each wafer layer 110-130 is a layer of oxide, typically 1 micron thick. When the layers 120-130 are bonded together, a 2 micron layer of oxide is formed between the guard layers 120 and 125 and the proof mass layer 130.

One technique to bond all the wafer layers 110-130 together is by a process called direct bonding. Before bonding, the wafer layers 110-130 are preferably cleaned and activated. Activation is done by either chemical or plasma surface activation. The wafer layers 110-130 are properly aligned and coupled to each other. Van Der Waals forces will cause the layers 110-130 to bond to each other. Since the Van Der Waals forces are relatively weak, the wafer layers 110-130 may be annealed at an elevated temperature. This temperature depends on the activation process. Older processes used temperatures in excess of 1000° C. With newer plasma processes, 400° C. may suffice. It can be envisioned that other methods or techniques can be used to bond the layers 110-130 together and achieve the same objective of the present invention.

Figure 2:
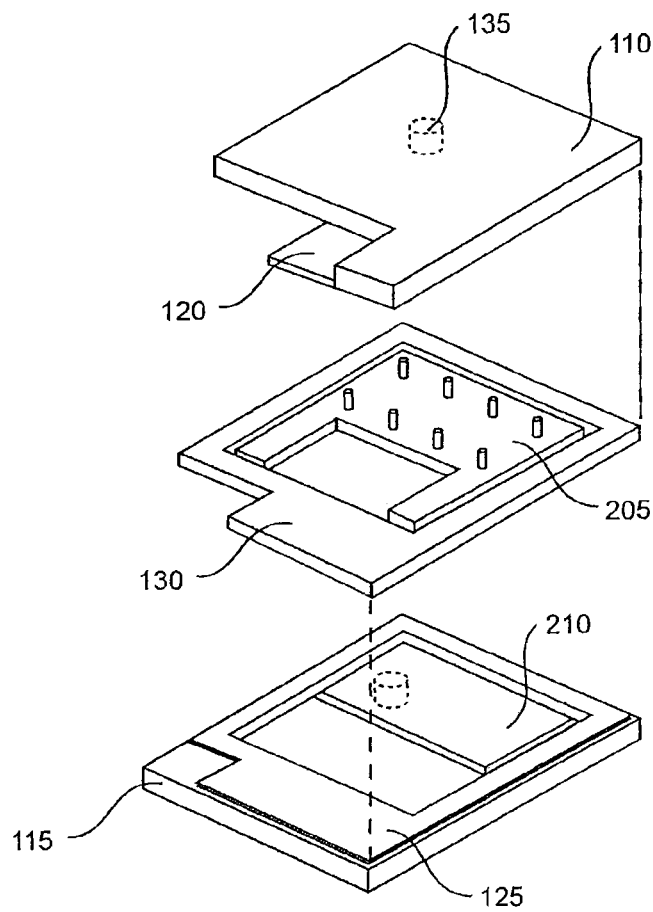
FIG. 2 is an assembly drawing of the silicon accelerometer sensor of FIG. 1.
Figure 3:
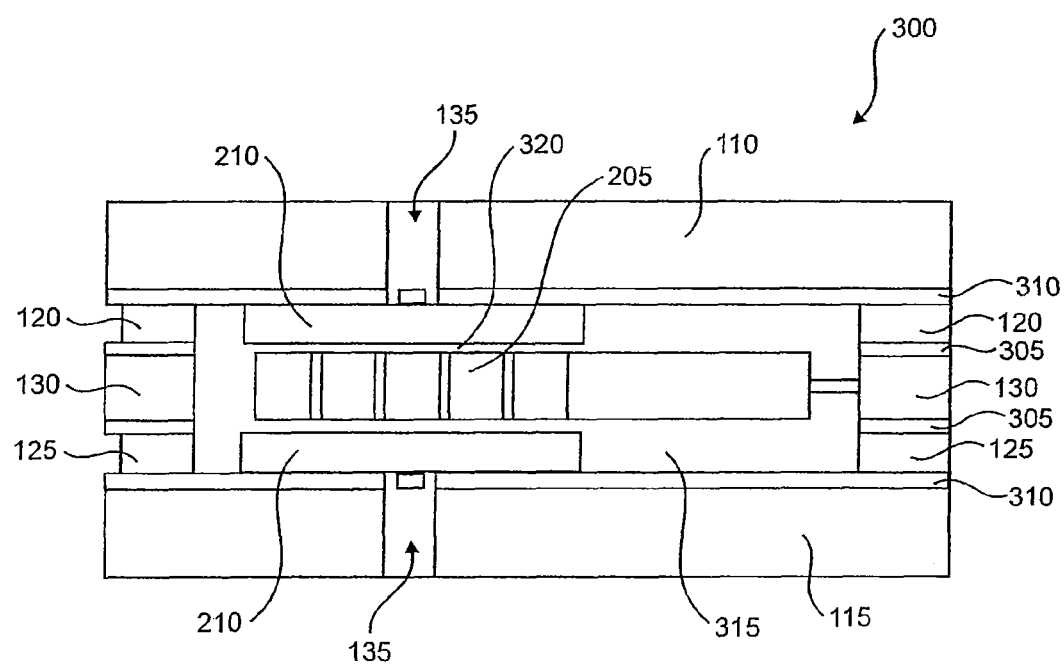
FIG. 3 is a side view of a silicon accelerometer sensor, according to one embodiment of the present invention.

FIG. 2 is an assembly drawing of the silicon accelerometer sensor 100 of FIG. 1. The assembly drawing shows the internal components of sensor 100. Contained within the proof mass layer 130 is a proof mass paddle 205 that may be coupled to the proof mass layer 130 by silicon hinges. On opposite sides of the paddle 205 are electrodes. FIGS. 2 and 3 show electrodes 210 contained within the guard layers 120 and 125 and parallel to one another. This configuration forms a capacitor between each electrode 210 and the paddle 205. In operation, the capacitance is used to determine the gap between the paddle 205 and each electrode 210. An electronic circuit supplies the proper voltage pulses to force the paddle to null, defined as the paddle position where both capacitances are equal.

FIG. 3 is a side view of a silicon accelerometer sensor 300, according to one embodiment of the present invention. The sensor 300 has an internal cavity 315 enclosed by layers 110-130. The internal cavity 315 houses the paddle 205 and electrodes 210, leaving a gap 320 between them. The sensor 300 also has a PM-G bond line 305 formed between the proof mass layer 130 and first and second guard layers 120 and 125. Similarly, the sensor 300 has a G-E bond line 310 formed between the guard layers 120 and 125 and the outside wafer layers 110 and 115, respectively.

To decrease the PM-G parasitic capacitance, the width of the bond line 305 between the proof mass and guard should be decreased. However, as the width of the bond line 305 is decreased, the bond strength is decreased, and the ruggedness and reliability of the chip may become compromised. Typically, the prior art width used for bond line 305 is 400 microns. This prior art width is a consequence of fabrication techniques used that does not account for the optimum width necessary to reduce parasitic capacitance and maintain reliable bond strength.

From a bond strength standpoint, the bond line 305 can be reduced substantially without compromising the reliability of the chip. Using a prior art bond line 305 of 400 microns, the sensor 300 can withstand a tensile force of about 50 lbs. Given the mass of the outside wafer layer 110 or 115 is 30 mg, the G loading would be about 700,000 G and the tensile strength of the oxide would be about 3400 PSI. On a number of sensors 300, the bonds do not necessarily delaminate, but the silicon breaks instead. Consequently, from a strength standpoint, the bond line 305 can be reduced by a factor of 2 to 4 without compromising the reliability of the chip.

Although a decrease in the width of the bond line 305 may not substantially affect the bond strength of the sensor 300, it may affect the hermeticity of the chip, either by increased leak failures or inherent permeability of the silicon dioxide. According to one embodiment of the present invention, a method for optimizing bond line 305 width for reduction of parasitic capacitance in MEMS accelerometers is provided.

Figure 4:
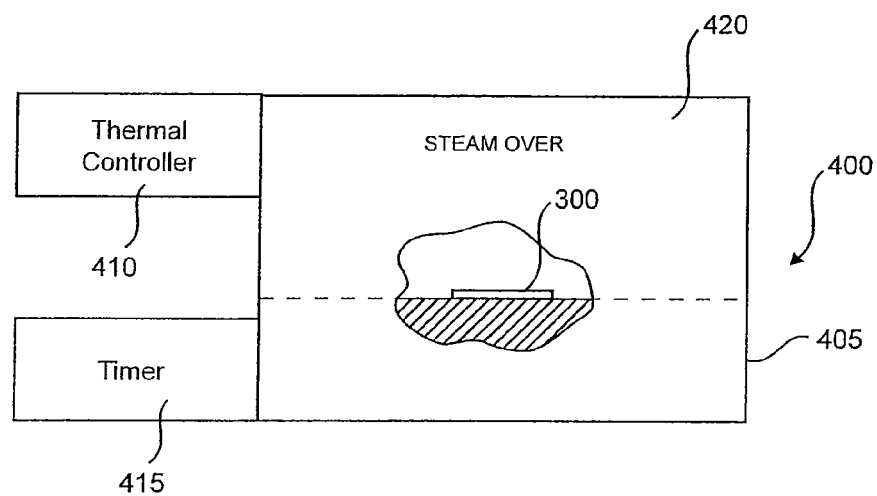
FIG. 4 is a schematic diagram showing a silicon accelerometer inside a steam oven in accordance with a method of the present invention.
Figure 5:
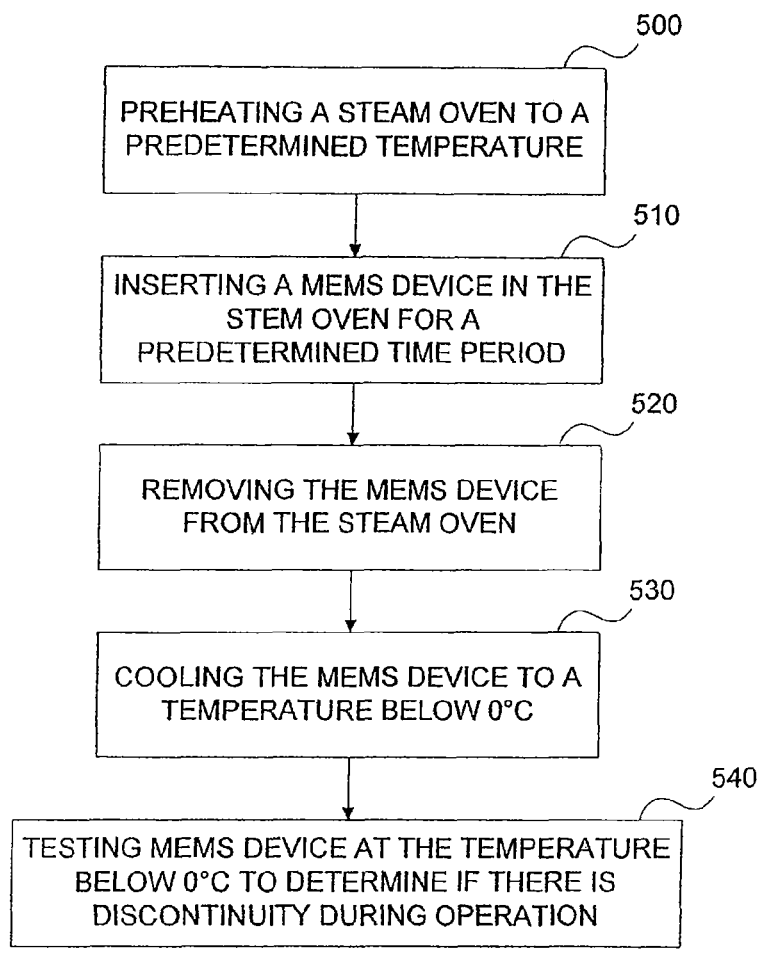
FIG. 5 is an exemplary flow chart depicting a method for bombing an accelerometer sensor with water vapor according to one embodiment of the present invention.

Referring to FIGS. 4 and 5, an application for practicing the method embodying the present invention, is generally designated 400. The sensor 300 is exposed to water vapor using a steam furnace or oven 405. Although a method utilizing an oven 405 is described herein, the method of the present invention applies equally to other steam producing sources.

According to a method embodying the present invention, the steam oven 405 is heated, at step 500, to an elevated temperature for evaporating water. For example, the temperature of the oven or furnace 405 can be preheated to approximately 100° C. A thermal controller 410 can be used to set the temperature of the steam oven 405, and a timer 415 can be used to set the period of exposure of the sensor 300 to the water vapor 420.

Once the steam oven 405 reaches the desired temperature, the MEMS device or sensor 300 is inserted, at step 510, for a desirable or predetermined period, for example, 24 hours. The period of exposure to the water vapor 420 is used in calculating the leak rate, which is discussed in detail below.

After bombing the MEMS device or sensor 300 with water vapor 420 for a specific period, the MEMS device is removed, at step 520, from the steam oven 405 and allowed to cool, at step 530, at a temperature below 0° C. In one embodiment, the MEMS device is cooled to a temperature of −55° C., as required by the military operational guidelines. At step 540, the MEMS device or sensor 300 is then tested at the temperature (below 0° C.) to determine if there is any discontinuity in performance of the device during operation.

Figure 6:
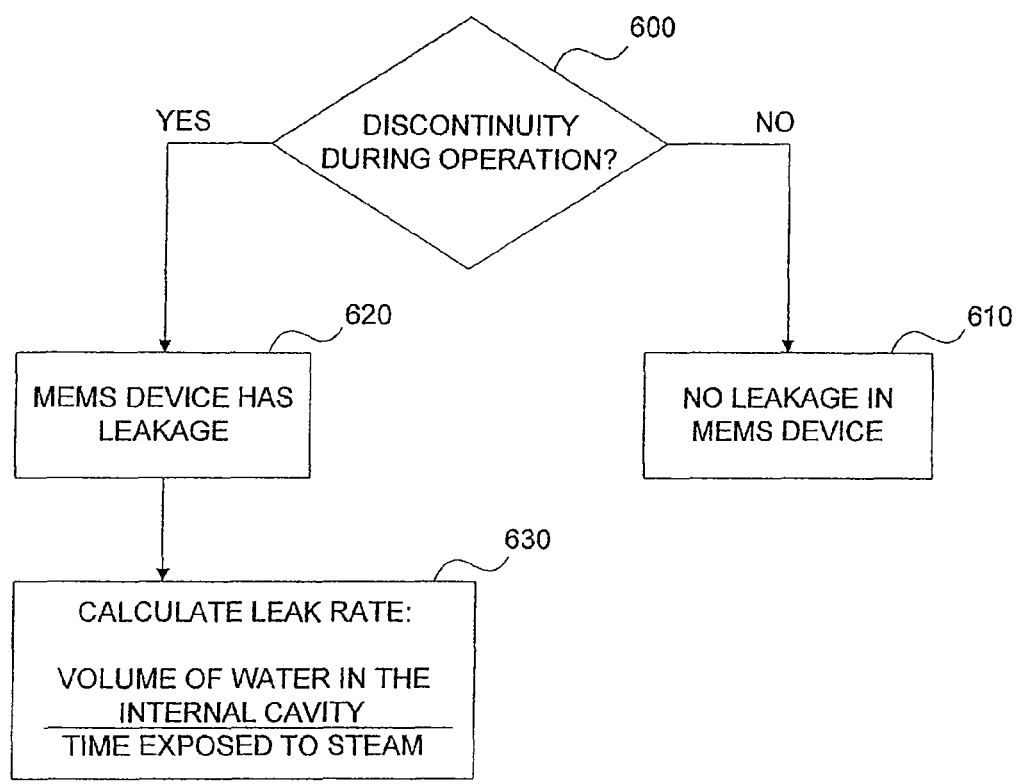
FIG. 6 is an exemplary flow chart depicting a method for determining leak rate of an accelerometer sensor according to one embodiment of the present invention.

Referring to FIG. 6, a method for determining leak rate of an accelerometer sensor 300 is provided in accordance with the present invention. When a MEMS device or sensor 300 is tested at a temperature below 0° C., for example −55° C., discontinuity in performance of the device during operation (Step 600) may occur. If the sensor 300 does not show any discontinuity in performance during operation at −55° C., then the sensor 300 does not leak, at step 610, and consequently, the reduced width of bond line 305 does not compromise the reliability of the chip.

Conversely, at step 620, if there is a discontinuity in performance during operation, then the MEMS device or sensor 300 has a leak that allowed water vapor 420 to seep through and crystallize at the lower temperature. Because the gap 320 between the paddle 205 and the electrodes 210 is about 2 microns, when the temperature is lowered to the −55° C. lower operating limit, even a very small vapor pressure in the sensor 300 will form an ice crystal or dendrite that blocks the motion of the paddle. This shows up as a discontinuity in operation of the accelerometer. At a temperature of −60° C., there is enough water in the chip to form a pillar of ice over 3 microns in diameter on both sides of the paddle 205.

At step 630, the leak rate can be calculated by dividing the volume of water in the sensor's internal cavity 315 by the water vapor bombing time period. The leak rate depends on (1) the temperature at which discontinuity of operation occurs, and (2) the time and temperature at which a MEMS device is bombed with water vapor. For example, suppose a MEMS device is bombed with saturated steam at about 100° C. for 24 hours. If there is discontinuity of operation at 0° C., it indicates that the vapor pressure of water in the MEMS device is above the equilibrium vapor pressure of ice or water at that temperature (4.58 mm of Hg). Given that the volume of an internal cavity 315 of a sensor 300 is about 4.36 μL, the chip would contain about $2.6 \times 10^{-6}$ cm$^3$ of water. Since, the MEMS device was exposed for 24 hours, it would have accumulated that water in 86,400 seconds, so the leak rate would be $3 \times 10^{-10}$ cm$^3$/s.

Similarly, if the chip shows a discontinuity of operation at −50° C., where the vapor pressure is 0.03 torr, then the leak rate is $2 \times 10^{-12}$ cm$^3$/s. These results show that the method embodying the present invention provides greater sensitivity than the prior art krypton bombing method.

It can be envisioned that bombing with water vapor 420 can be accomplished at different times and temperatures. For example, the bomb time or temperature could be increased. A temperature of 120° C. would approximately double the external water vapor pressure and a temperature of 180° C. would increase it 10 fold. Alternatively, the MEMS device can be cooled to a temperature even lower than −55° C. during testing.

One factor that should be taken into account at low temperatures, where the total amount of water condensing is low, is the possibility that all the water vapor 420 in the MEMS device could condense at some benign spot, so that the operation of the device would be unaffected. This may result in a false pass. However, based on experimental results obtained for low temperature failures, it appears that the gap 320 is a good nucleation area for the water vapor 420.

It is understood by a person skilled in the art that a sensor 300 can be fabricated with a combination of the prior art bond line 305 width of 400 microns with the reduced bond line 305 width of 100-200 microns. If this sensor 300 is subjected to water vapor bombing, at step 510, then any compromise of hermeticity with the reduced bond line 305 width could be determined statistically during operation testing, at step 540.

Although a decrease in the width of the bond line 305 may not substantially affect the bond strength of the sensor 300, it may affect the hermeticity of the chip, either by increased leak failures or inherent permeability of the silicon dioxide.

Although the hermeticity of a MEMS device depends on leak rates, it is also affected by inherent permeability of the silicon dioxide. Even if there is a perfect seal, permeation of water vapor 420 through the oxide may affect hermeticity. To determine the effect of permeation on the hermeticity of MEMS devices, permeation data was ascertained for Helium, Hydrogen, Deuterium and Neon at 700° C. At this temperature the permeation coefficient of Neon (the closest of the four to water in size) is about $1 \times 10^{-9}$ cm$^3$ mm/cm$^2$ sec cm of Hg. Hydrogen and Deuterium are about twice as large as Neon, while Helium is about 20 times as large as Neon. The permeation coefficient of Neon would be equivalent to a leak rate of about $10^{-9}$ cm$^3$/s.

If the MEMS device is bombed with water vapor 420 at a temperature of 100° C., the permeation constants would likely be several orders of magnitude lower than Neon at 700° C. Consequently, permeation through the oxide layer would not affect the hermeticity and reliability of a MEMS device with a reduced bond line 305 width of 100-200 microns. Even if permeation proved to be an issue for the long term stability of the MEMS device, it could be dealt with, for example, by filling the MEMS device with the same gas as the system housing the device.

While certain exemplary embodiments have been described and shown in the accompanying drawings, it is to be understood that such embodiments are merely illustrative of and not restrictive on the broad invention.

What is claimed is:

1. A method for determining a leak rate through a bond line of a MEMS device with a cavity having a predetermined volume, the method comprising the steps of:
    exposing the MEMS device to a fluid in a chamber for a predetermined time period at a first temperature that vaporizes the fluid;
    cooling the MEMS device to a second temperature that freezes the fluid;
    operating the MEMS device at a third temperature that maintains the fluid in a frozen state until occurrence of discontinuity in performance, the discontinuity in performance indicating that fluid has leaked into the MEMS cavity through the bond line;
    upon occurrence of a discontinuity in performance, determining the volume of the fluid in the MEMS device using the third temperature and the predetermined volume of the MEMS cavity; and
    determining the leak rate through the bond line using the determined volume of the fluid in the MEMS device and the predetermined time period the MEMS device was exposed to the vaporized fluid.

2. The method of claim 1, wherein the fluid is water.

3. The method of claim 1, wherein the third temperature is equal to the second temperature.

4. The method of claim 1, wherein the first temperature is approximately 100° C.

5. The method of claim 1, Wherein the second temperature is approximately −55° C.

6. The method of claim 1, wherein the second temperature is approximately below 0° C.

7. The method of claim 1 wherein the step of determining the leak rate comprises dividing the determined volume of the fluid in the MEMS device by the predetermined time period the MEMS device was exposed to the vaporized fluid.

* * * * *